(12) United States Patent
Sato

(10) Patent No.: US 11,818,853 B2
(45) Date of Patent: Nov. 14, 2023

(54) POWER SUPPLY APPARATUS

(71) Applicant: CANON KABUSHIKI KAISHA, Tokyo (JP)

(72) Inventor: Takeshi Sato, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/591,305

(22) Filed: Feb. 2, 2022

(65) Prior Publication Data
US 2022/0279670 A1    Sep. 1, 2022

(30) Foreign Application Priority Data

Feb. 26, 2021    (JP) .................................. 2021-030082

(51) Int. Cl.
| | | |
|---|---|---|
| H05K 5/02 | (2006.01) | |
| G03G 21/16 | (2006.01) | |
| G03G 15/00 | (2006.01) | |

(52) U.S. Cl.
CPC .......... *H05K 5/0247* (2013.01); *G03G 15/80* (2013.01); *G03G 21/1652* (2013.01); *H05K 5/0217* (2013.01)

(58) Field of Classification Search
CPC .... H05K 5/0247; H05K 5/0217; G03G 15/80; G03G 21/1652
See application file for complete search history.

(56) References Cited

U.S. PATENT DOCUMENTS

2011/0048792 A1 * 3/2011 Masaka .............. G03G 21/1652
174/480
2015/0378303 A1 * 12/2015 Ohata .................... G03G 15/80
174/126.1

FOREIGN PATENT DOCUMENTS

| CN | 107683060 A | * | 2/2018 | ............. H05K 1/181 |
| GB | 2466535 A | * | 6/2010 | ............. G06F 1/187 |
| JP | 2011077874 A | | 4/2011 | |
| JP | 2011205341 A | | 10/2011 | |
| JP | 2017028054 A | | 2/2017 | |
| JP | 2017224893 A | | 12/2017 | |

* cited by examiner

*Primary Examiner* — Ryan D Walsh
(74) *Attorney, Agent, or Firm* — Canon U.S.A., Inc. I.P. Division

(57) ABSTRACT

A power supply apparatus includes a frame having a plate-shape, electric wiring that transmits an electric signal or electric power, a guide unit that guides the electric wiring along a surface of the frame, and a facing member disposed at a position closer to the frame surface than that of the electric wiring to overlap the electric wiring. The guide unit includes first, second, and third guide members in contact with the electric wiring. The third guide member is in contact with the electric wiring from a side opposite to a side in which the first and second guide members are in contact with the electric wiring and is disposed at a position not in a region between the first and second guide members. The electric wiring is curved in a direction away from the facing member in the region between the first guide member and second guide member.

24 Claims, 9 Drawing Sheets

POWER SUPPLY APPARATUS

BACKGROUND

Field

The present disclosure relates to a power supply apparatus including a guide unit that guides electric wiring for transmitting an electric signal or electric power.

Description of the Related Art

Conventionally, a power supply apparatus mounted on a laser printer or the like has been generally configured to include a plurality of electric boards inside the apparatus for various kinds of operation and control, and connect between the plurality of electric boards via electric wiring, thereby transmitting and receiving an electric signal and electric power. Japanese Patent Application Laid-Open No. 2017-224893 discusses an image reading apparatus including a reading unit configured to read an image on a sheet and an automatic document feeder (ADF) unit configured to convey the sheet that are connected via a wire bundle, and further including a cover unit covering the wire bundle. The cover unit is configured to protect the wire bundle while securing a pivotal movement amount of the ADF unit relative to the reading unit.

In the case of a configuration in which the electric wiring is routed in the vicinity of various movable members included in an image forming apparatus, the image reading apparatus, or the like, the electric wiring may be damaged if contacting the movable members. The electric wiring may also be damaged if contacting an electric element, a heat generation element, or the like other than the movable members. Conventionally, this has raised the necessity of providing a space for securing a sufficient distance between the electric wiring and the movable members, the electric element, or the like, or providing a shielding member therebetween. Such configurations have an issue such as an increase in the size of the apparatus or an increase in the number of components.

SUMMARY

The present disclosure is directed to providing a power supply apparatus capable of preventing a contact between electric wiring and a facing member influential to the electric wiring without an increase in the size of the apparatus.

According to an aspect of the present disclosure, a power supply apparatus includes a frame having a plate-shape, electric wiring configured to transmit an electric signal or electric power, a guide unit configured to guide the electric wiring along a surface of the frame, and a facing member disposed at a position closer to the surface of the frame than a position of the electric wiring, wherein the facing member overlaps the electric wiring when viewed in a direction perpendicular to the surface of the frame, wherein the guide unit includes a first guide member and a second guide member in contact with the electric wiring from one side close to the surface of the frame, wherein the first guide member and the second guide member are disposed at respective positions with the facing member disposed between the first guide member and the second guide member in a longitudinal direction of the electric wiring, wherein the guide unit further includes a third guide member in contact with the electric wiring from an opposite side of the one side from which the first guide member and the second guide member are in contact with the electric wiring, wherein the third guide member is disposed at a position not in a region between the first guide member and the second guide member in the longitudinal direction of the electric wiring, and wherein the electric wiring is curved in a direction away from the facing member in the region between the first guide member and the second guide member.

Further features of the present disclosure will become apparent from the following description of exemplary embodiments with reference to the attached drawings.

DESCRIPTION OF THE EMBODIMENTS

The configuration of an image forming apparatus 100 according to a first exemplary embodiment will be described. The image forming apparatus 100 according to the present exemplary embodiment is a monochromatic laser beam printer that employs an electrophotographic process and forms an image on paper P that is a recording material (sheet) with toner (developer) based on image information transmitted from an external apparatus such as a personal computer.

As will be used in the following description, a Z direction is defined as the height direction (a direction opposite to the direction of gravitational force) of the image forming apparatus 100 when the image forming apparatus 100 is set on a horizontal surface. An X direction is defined as a direction intersecting the Z direction and extending in parallel with an axial direction (main scanning direction) of a photosensitive drum 103a, which will be described below. A Y direction is defined as a direction intersecting the X direction and the Z direction. Desirably, the X direction, the Y direction, and the Z direction perpendicularly intersect with one another. Further, for the sake of convenience, a positive side and a negative side in the X direction will be referred to as a right side and a left side, respectively. A positive side and a negative side in the Y direction will be referred to as a front side or a front surface side and a back side or a back surface side, respectively. A positive side and a negative side in the Z direction will be referred to as an upper side and a lower side, respectively.

Figure 1:
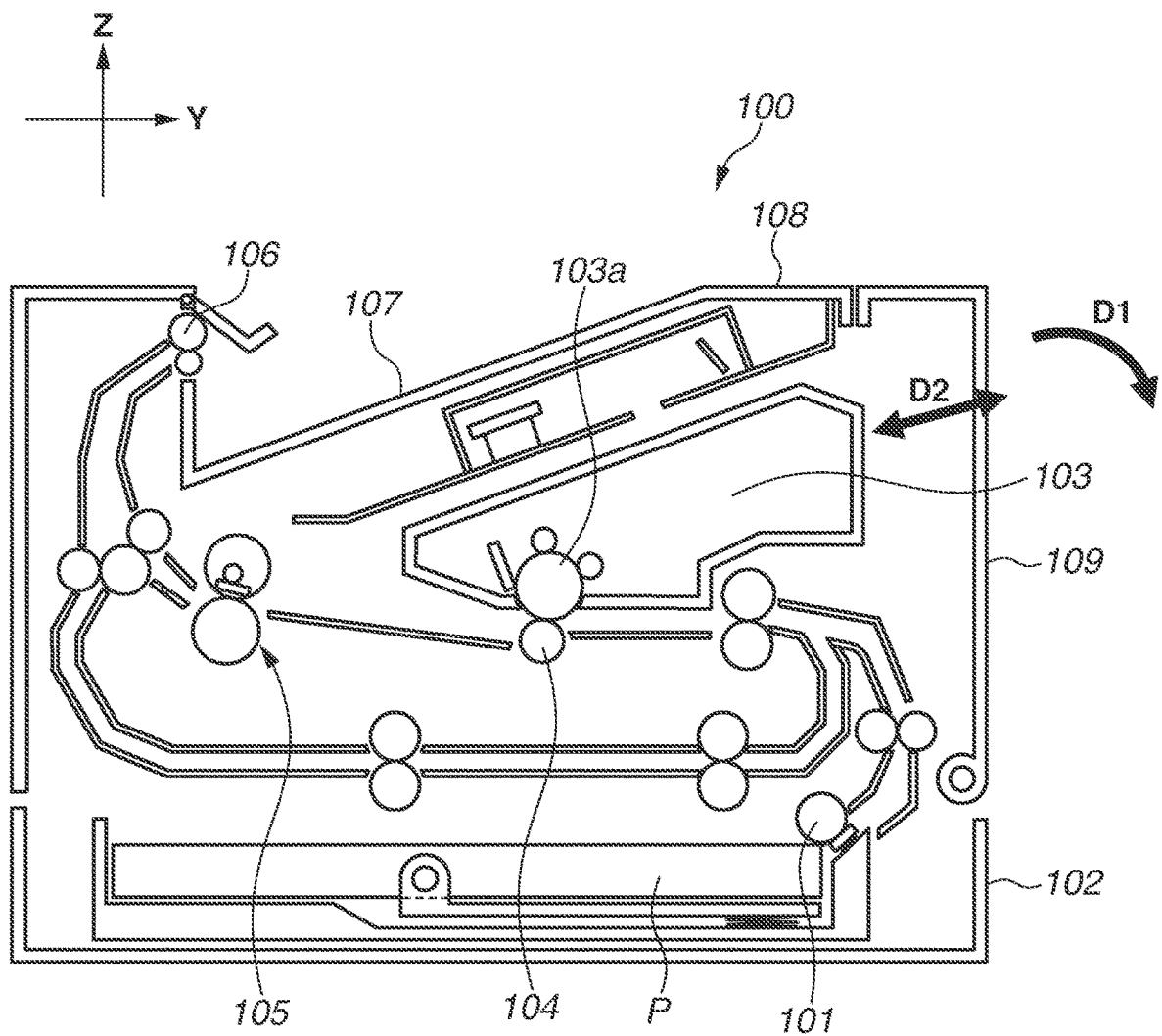
FIG. 1 schematically illustrates a configuration of an image forming apparatus according to a first exemplary embodiment.

FIG. 1 schematically illustrates a configuration of the image forming apparatus 100. The image forming apparatus 100 includes a sheet feeding cassette 102 capable of storing a plurality of pieces of paper P. A process cartridge 103 includes the photosensitive drum 103a as an image bearing member and is configured to be attachable to and detachable from an apparatus main body 108 (housing) of the image forming apparatus 100. The photosensitive drum 103a is rotatable about an axis extending in the X direction as described above. A cover 109 forms part of the apparatus main body 108 and is openable and closable in a direction indicated by an arrow D1. With the cover 109 opened, the process cartridge 103 is attachable to and detachable from the apparatus main body 108 in a direction indicated by an arrow D2.

When the image forming apparatus 100 receives a print start signal, a sheet feeding roller 101 starts rotating, and the paper P stacked in the sheet feeding cassette 102 is conveyed toward the downstream side one by one. The paper P is sandwiched between the photosensitive drum 103a a surface of which has toner developed thereon and a transfer roller 104, and thus a toner image is transferred to the paper P. The paper P to which the toner image has been transferred is heated and pressed by a fixing device 105, by which the toner image is fixed to the paper P. The paper P with the toner image fixed thereon is discharged to the outside of the apparatus by a discharge roller pair 106 and is stacked on a discharge tray 107.

Figure 2:
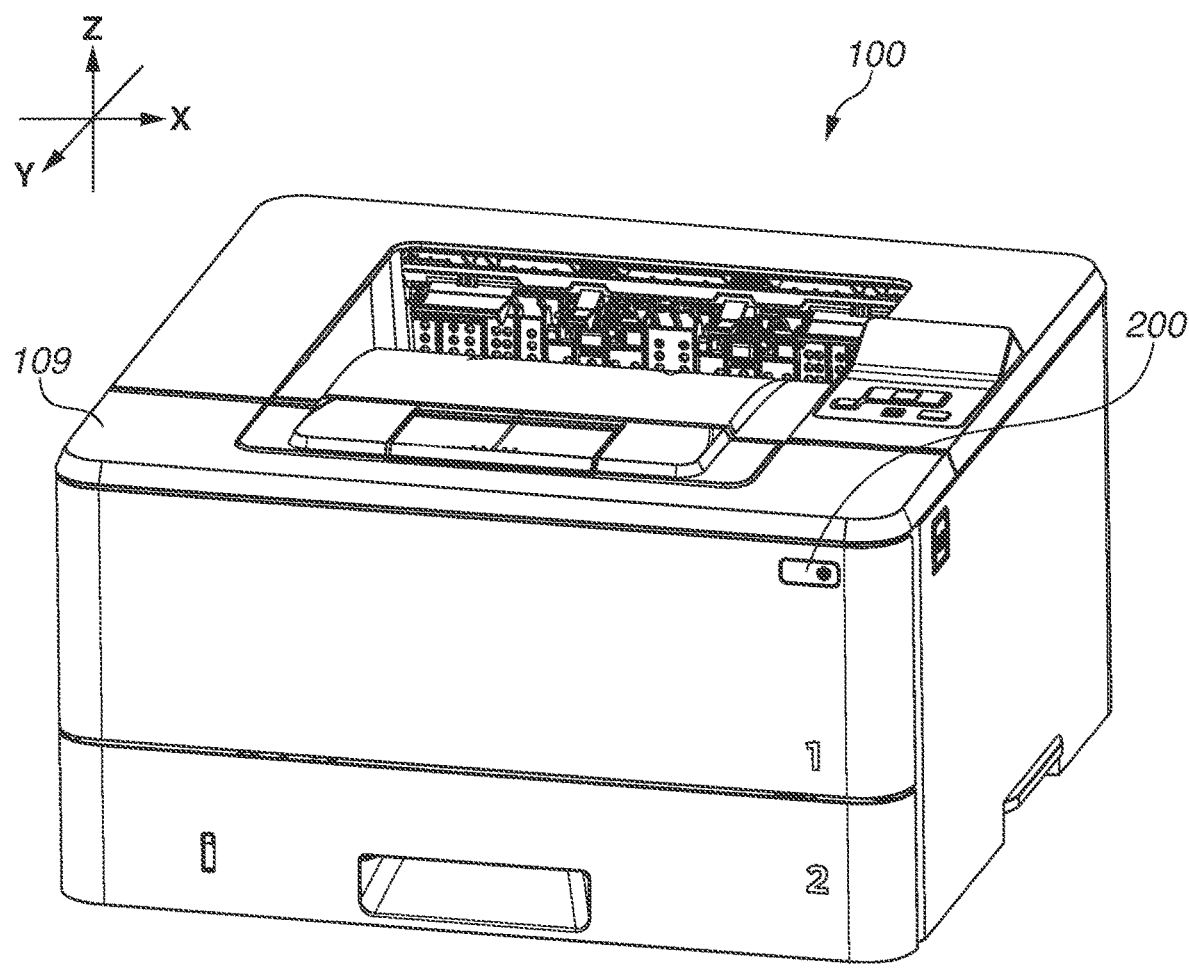
FIG. 2 is a perspective view illustrating an external appearance of the image forming apparatus according to the first exemplary embodiment.

FIG. 2 is a perspective view illustrating the external appearance of the image forming apparatus 100. As illustrated in FIG. 2, the cover 109 and a power switch 200 are disposed on a front surface of the image forming apparatus 100. The power switch 200 is disposed on the right side of the front surface of the apparatus. How the power switch 200 is supported inside the apparatus will be described with reference to the next drawing.

Figure 3:
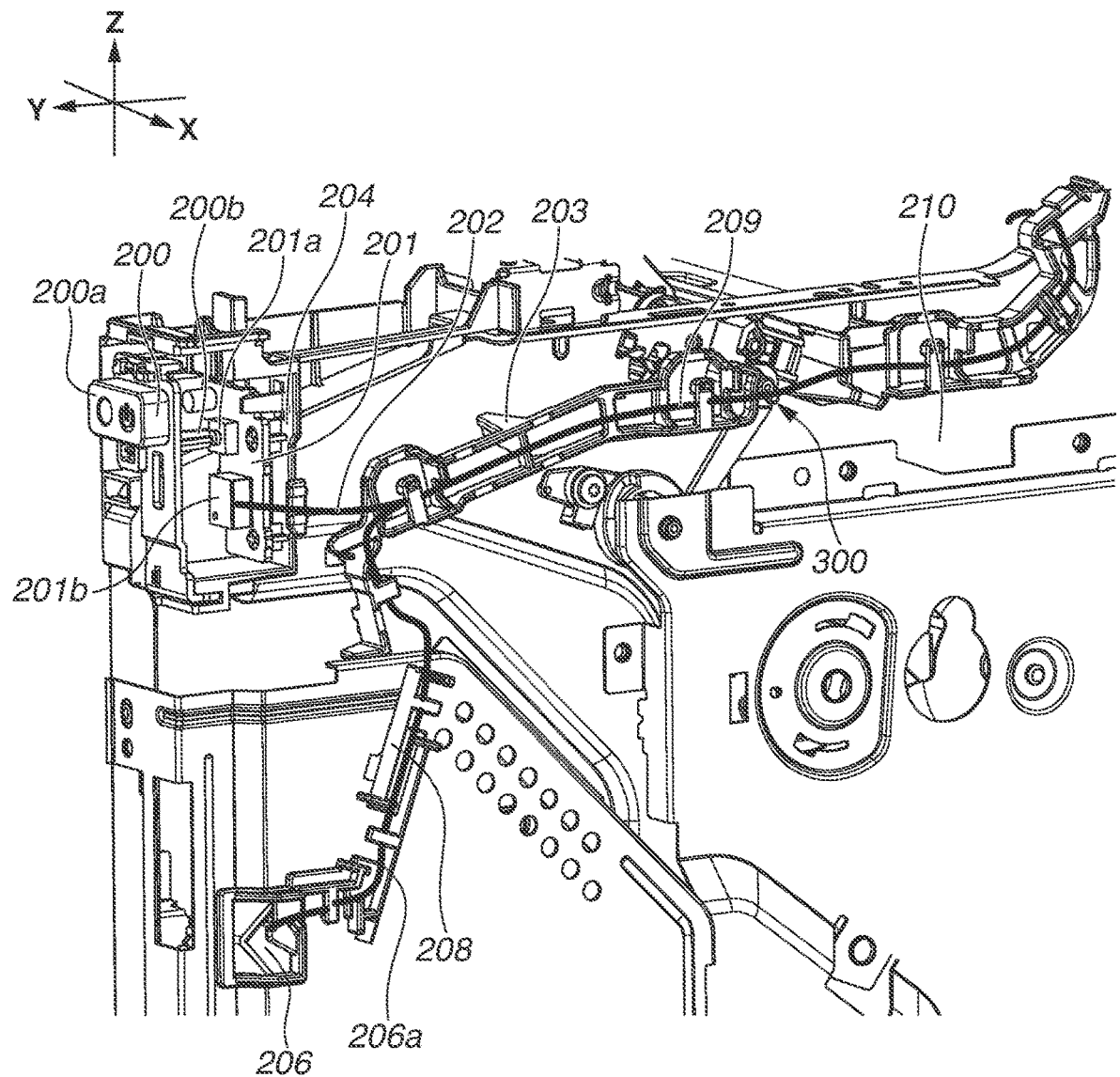
FIG. 3 is a perspective view of a right-side plate frame according to the first exemplary embodiment.

FIG. 3 is a perspective view illustrating a guide configuration of electric wiring. A right-side plate frame 210 (hereinafter simply referred to as a frame 210) forms part of the framework of the image forming apparatus 100. The frame 210 is made of a metallic plate and is a plate-shaped member extending in the YZ plane. A power switch board 201 includes a tactile switch 201a and a power switch connector 201b that are mounted on a surface thereof, and is held by a switch board holder 204. A power switch wire bundle 202 (electric wiring) is a bundle of a plurality of signal lines or power lines. One end of the power switch wire bundle 202 is connected to the power switch connector 201b. The other end of the power switch wire bundle 202 is connected to a not-illustrated control board that controls operation of the image forming apparatus 100. The power switch wire bundle 202 is held by an electric wiring guide 203 and is guided along a predetermined route. The switch board holder 204 and the electric wiring guide 203 are fixed to the frame 210.

The power switch 200 described with reference to FIG. 2 includes a pressing surface 200a, which can be pressed by a user, and a pressing boss 200b, which is disposed on the back surface side of the pressing surface 200a. The pressing boss 200b is disposed at a position facing the tactile switch 201a. The power switch 200 is configured in such a manner that the pressing boss 200b presses the tactile switch 201a when the user presses the pressing surface 200a. Information about whether the tactile switch 201a is pressed is transmitted to the power switch connector 201b via the power switch board 201, and is further transmitted to the not-illustrated control board via the power switch wire bundle 202. As a result, power-on and power-off of the image forming apparatus 100 are switched.

A sheet feeding solenoid 206 is an actuator utilizing an electromagnetic force and includes a sheet feeding solenoid wire bundle 206a (electric wiring). The sheet feeding solenoid wire bundle 206a is held by a solenoid wire bundle guide 208 and the electric wiring guide 203 and is connected to the not-illustrated control board. When the control board receives the print start signal, a sheet feeding start signal is transmitted to the sheet feeding solenoid 206 via the sheet feeding solenoid wire bundle 206a. The image forming apparatus 100 is configured to be able to control rotational operation of the sheet feeding roller 101 by the sheet feeding solenoid 206 operating based on the sheet feeding start signal. The power switch wire bundle 202 and the sheet feeding solenoid wire bundle 206a are guided along the same route in a partial region by the electric wiring guide 203 and form a wire bundle pair 209 in the partial region. The wire bundle pair 209 is guided along a surface of the frame 210 so as to be routed in the vicinity of a link unit 300.

Figure 4:
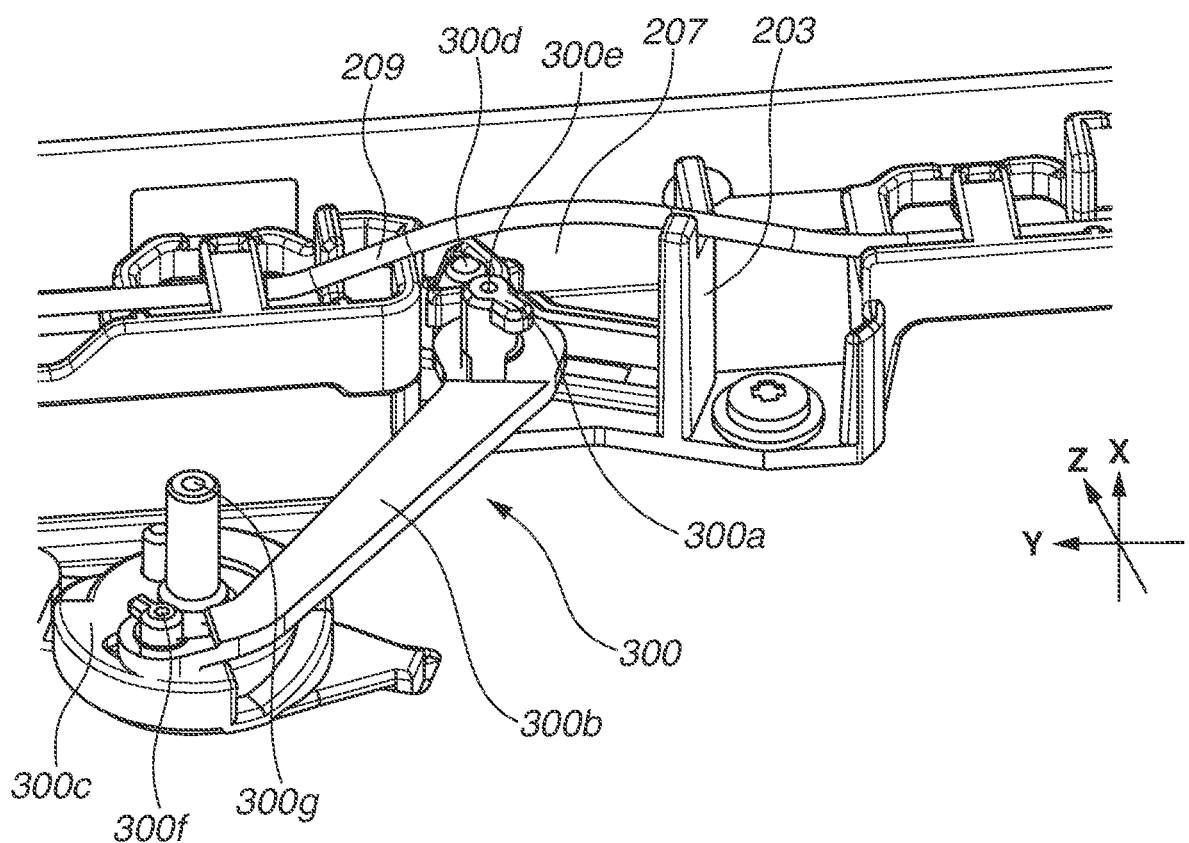
FIG. 4 is a perspective view illustrating the configurations of a wire bundle guide and a link unit according to the first exemplary embodiment.

FIG. 4 is a perspective view illustrating a configuration of the link unit 300 according to the present exemplary embodiment. The link unit 300 is a four-joint link mechanism having a closed loop structure. The link unit 300 includes a first link 300a, a second link 300b, a third link 300c, a first joint 300d, a second joint 300e, a third joint 300f, and a fourth joint 300g. The plurality of joints each includes a pivot axis extending in a direction perpendicular to the surface of the frame 210 (X direction). The first link 300a is held by the electric wiring guide 203 pivotably about the first joint 300d. The first link 300a is positioned in the direction of the pivot axis of the first joint 300d by the electric wiring guide 203. The third link 300c is pivotable about the fourth joint 300g. The second link 300b is held by the first link 300a and the third link 300c, and is pivotable about the second joint 300e and the third joint 300f. The first link 300a faces the wire bundle pair 209 via a gap 207.

Figure 5A:
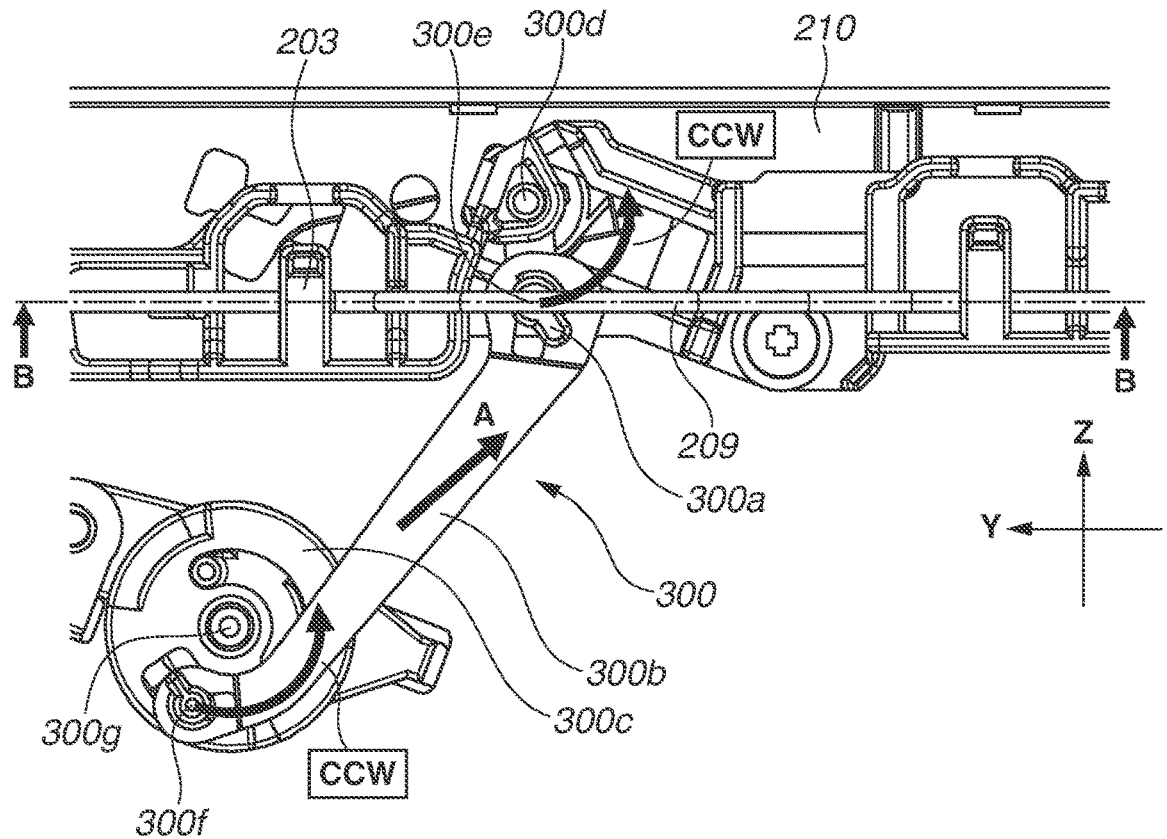
FIGS. 5A and 5B are perspective views illustrating the operation of the link unit according to the first exemplary embodiment.
Figure 5B:
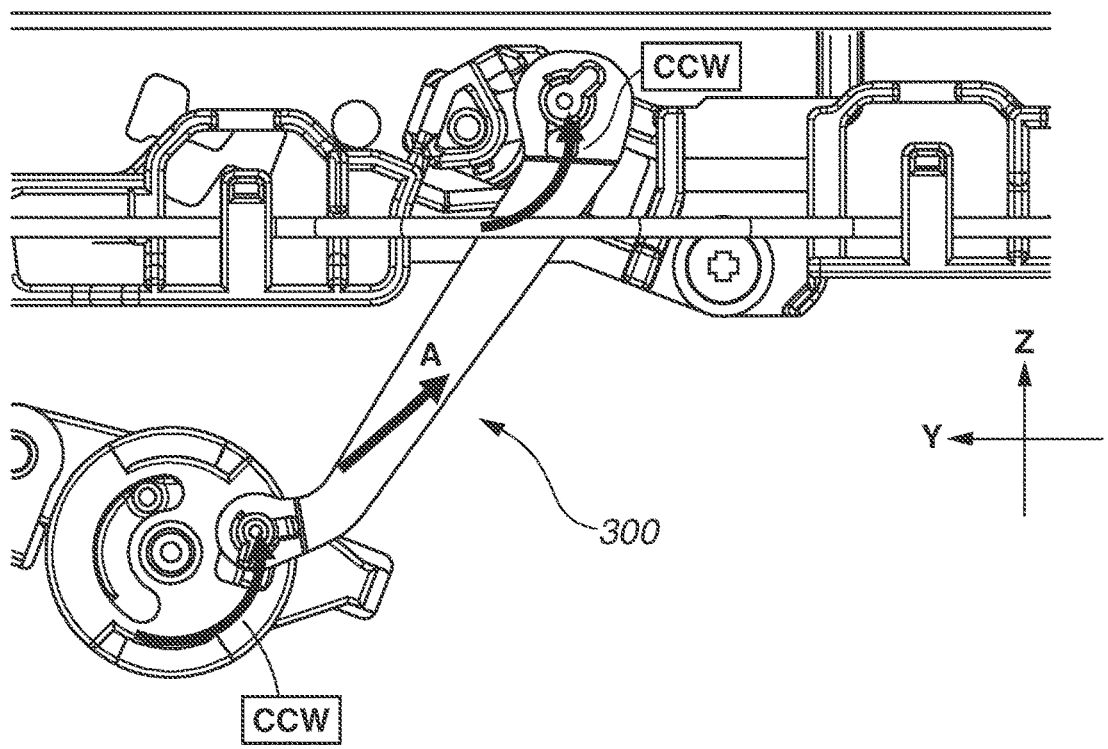

FIGS. 5A and 5B illustrate operation of the link unit 300 according to the present exemplary embodiment. The link unit 300 is part of a mechanism for preventing erroneous attachment of the process cartridge 103, and operates in conjunction with operation of inserting and pulling out the process cartridge 103. The mechanism for preventing erroneous attachment is a mechanism for preventing a cartridge designed to be used in a different product model or a cartridge containing toner of a different color from being erroneously attached. FIG. 5A illustrates a state in which the process cartridge 103 is pulled out of the image forming apparatus 100, and FIG. 5B illustrates a state in which the process cartridge 103 is inserted in the image forming apparatus 100.

The first link 300a extends toward the negative side in the X direction (the inner side of the apparatus) by penetrating through the frame 210 and is configured to contact the process cartridge 103 compatible with the link unit 300. In the course of insertion of the process cartridge 103, the first link 300a contacts the process cartridge 103 and pivots in a counterclockwise (CCW) direction about the first joint 300d. The second link 300b moves in a direction indicated by an arrow A in conjunction with a pivotal operation of the first link 300a. The third link 300c pivots in the CCW direction about the fourth joint 300g. Then, the four-joint link unit 300 moves into the state illustrated in FIG. 5B in which a not-illustrated shutter blocking the insertion of the process cartridge 103 is opened and the process cartridge 103 is allowed to be inserted into a predetermined position in the image forming apparatus 100. The link unit 300 is configured in this manner.

As illustrated in FIGS. 5A and 5B, it can be understood that the first link 300a moves through a position overlapping the wire bundle pair 209 when being viewed from the direction perpendicular to the surface of the frame 210. This means that the image forming apparatus 100 is to be configured to prevent the first link 300a and the wire bundle pair 209 from interfering with each other.

Figure 6A:
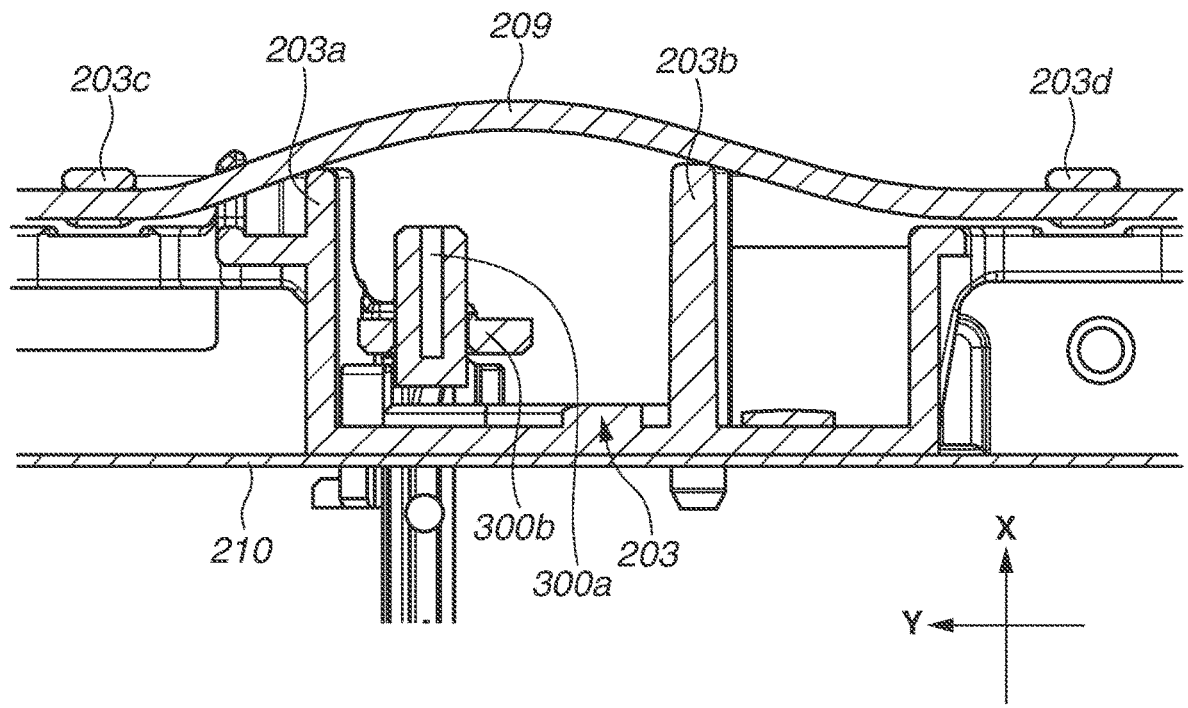
FIGS. 6A and 6B are cross-sectional views each illustrating the configurations of the wire bundle guide and the link unit according to the first exemplary embodiment.
Figure 6B:
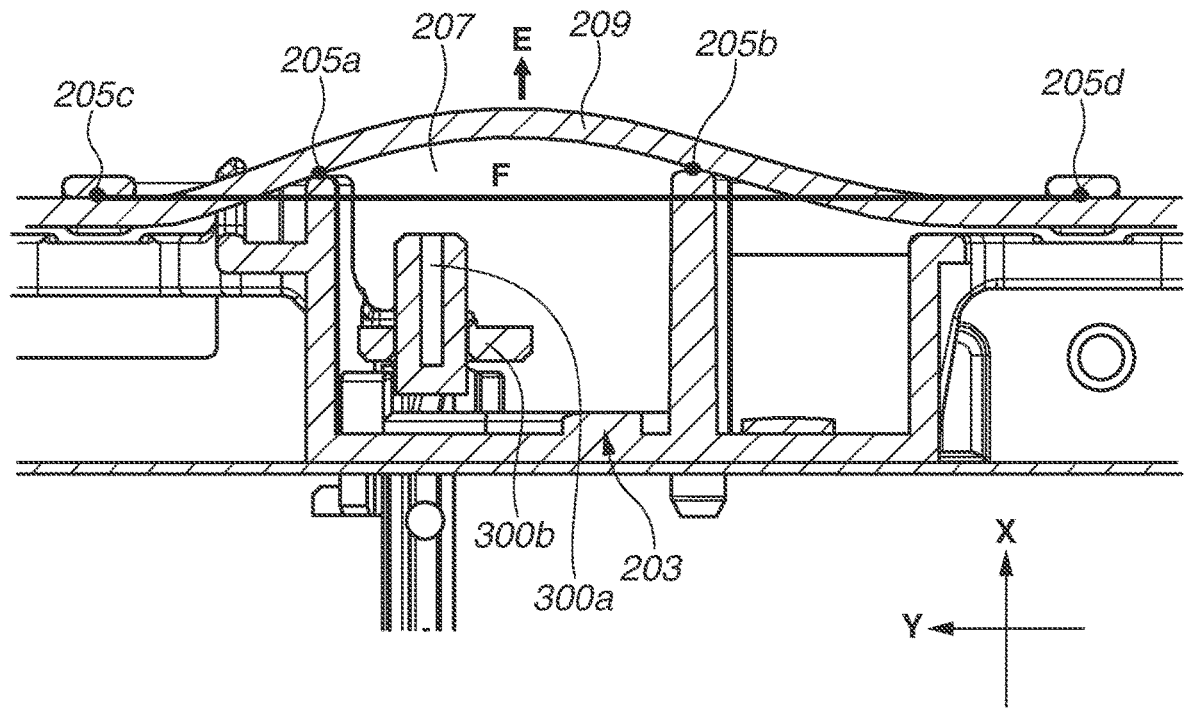

FIGS. 6A and 6B illustrate the configuration of the electric wiring guide 203 according to the present exemplary embodiment. FIGS. 6A and 6B are cross-sectional views cut along a chain line B illustrated in FIG. 5A. As illustrated in FIG. 6A, the electric wiring guide 203 includes a first guide member 203a, a second guide member 203b, a third guide member 203c, and a fourth guide member 203d. The first guide member 203a and the second guide member 203b are disposed so as to face each other with the first link 300a, which is a facing member in the present exemplary embodiment, being disposed between the first and second guide members 203a and 203b in the longitudinal direction of the wire bundle pair 209. The first guide member 203a and the second guide member 203b are in contact with the wire bundle pair 209 from one side on which the first link 300a is disposed (one side closer to the surface of the frame 210). The third guide member 203c is disposed at a position opposite of the first link 300a relative to the first guide member 203a.

The fourth guide member 203d is disposed at a position opposite of the first link 300a relative to the second guide member 203b. The third guide member 203c and the fourth guide member 203d are in contact with the wire bundle pair 209 from a side opposite of the one side from which the first guide member 203a and the second guide member 203b are in contact with the wire bundle pair 209.

As illustrated in FIG. 6B, a first protrusion portion 205a and a second protrusion portion 205b refer to end portions of the first guide member 203a and the second guide member 203b protruding toward the positive side in the direction perpendicular to the surface of the frame 210 (X direction), respectively. A third protrusion portion 205c and a fourth protrusion portion 205d refer to end portions of the third guide member 203c and the fourth guide member 203d protruding toward the negative side in the direction perpendicular to the surface of the frame 210 (X direction), respectively.

In FIG. 6B, the first protrusion portion 205a to the fourth protrusion portion 205d are each in contact with the wire bundle pair 209. A line F refers to a line connecting the third protrusion portion 205c and the fourth protrusion portion 205d, and the first protrusion portion 205a and the second protrusion portion 205b are located on the positive side in the X direction with respect to the line F. Configuring the electric wiring guide 203 in this manner causes the wire bundle pair 209 to be curved in a separation direction E so that the gap 207 between the wire bundle pair 209 and the first link 300a increases.

Figure 7A:
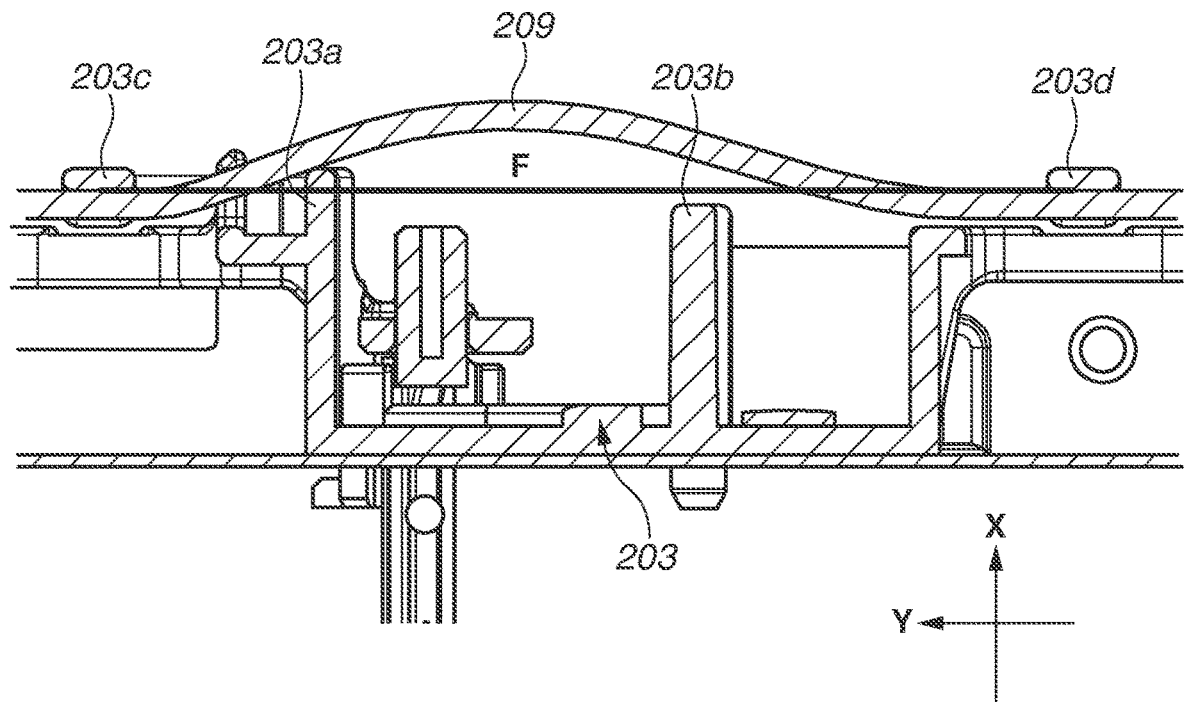
FIGS. 7A and 7B are cross-sectional views each illustrating the configurations of a wire bundle guide and a link unit according to an exemplary modification.

The electric wiring guide 203 is configured in such a manner that both the first protrusion portion 205a and the second protrusion portion 205b protrude toward the positive side in the X direction with respect to the line F in FIG. 6B, but the configuration thereof is not limited thereto. As illustrated in FIG. 7A, the electric wiring guide 203 may be configured in such a manner that any one of the first protrusion portion 205a or the second protrusion portion 205b protrudes toward the positive side in the X direction with respect to the line F. Further, the first protrusion portion 205a and the second protrusion portion 205b do not have to protrude toward the positive side in the X direction with respect to the line F and may be located at the same position as the line F.

Figure 7B:
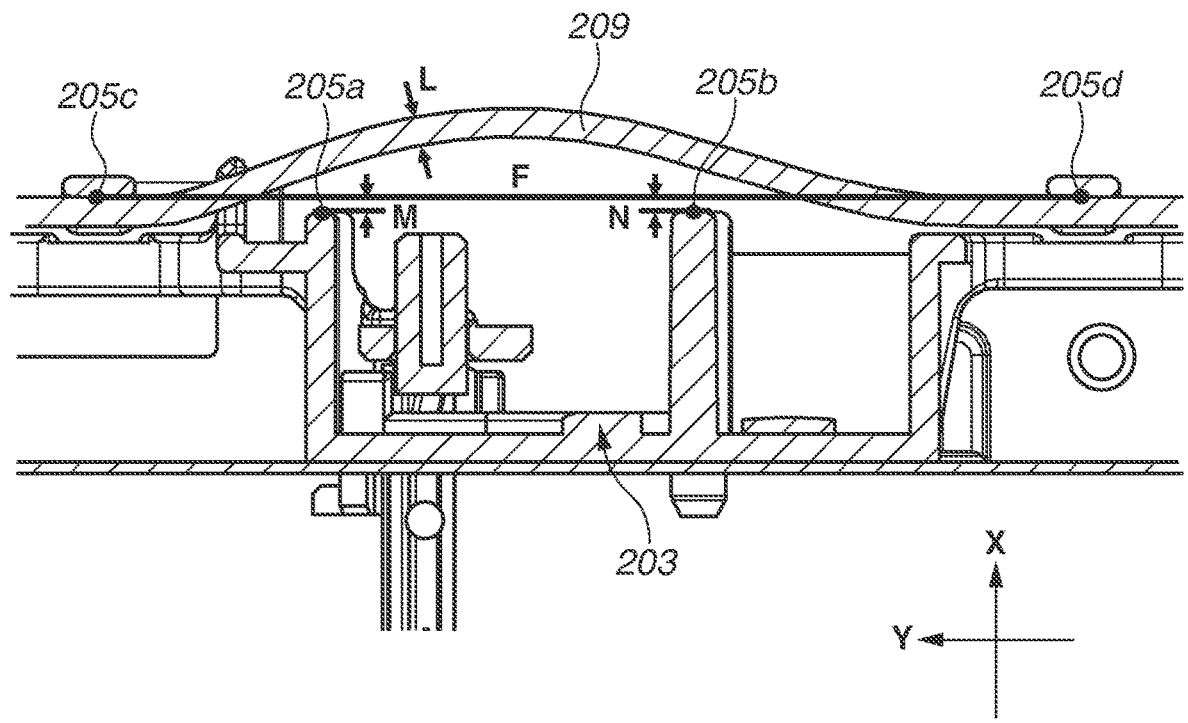

Further, as illustrated in FIG. 7B, both the first protrusion portion 205a and the second protrusion portion 205b may be located on the negative side in the X direction with respect to the line F. In this case, the electric wiring guide 203 is desirably configured to satisfy the relationships M<L and N<L, where L represents the diameter of the electric wiring having the smallest diameter in the wire bundle pair 209, M represents the distance between the first protrusion portion 205a and the line F, and N represents the distance between the second protrusion portion 205b and the line F.

The third guide member 203c and the fourth guide member 203d may be disposed anywhere as long as they are located at positions other than the region between the first guide member 203a and the second guide member 203b in the longitudinal direction of the wire bundle pair 209 (Y direction), and the positions thereof are not particularly limited. In other words, a distance between the first guide member 203a and the second guide member 203b, a distance between the first guide member 203a and the third guide member 203c, and a distance between the second guide member 203b and the fourth guide member 203d are not particularly limited. The magnitude relationship among the above-described distances is not particularly limited as long as the electric wiring guide 203 is configured in such a manner that the wire bundle pair 209 is curved in the separation direction E in the region between the first guide member 203a and the second guide member 203b, although this also depends on the rigidity of the wire bundle pair 209.

Figure 8A:
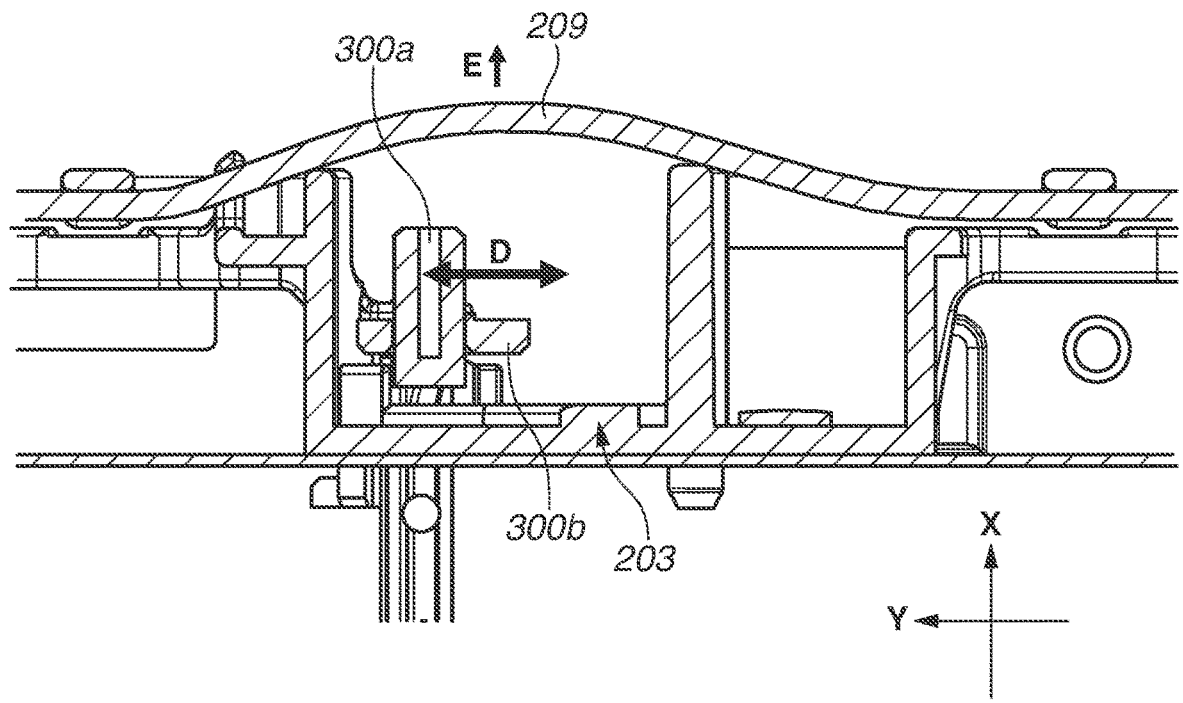
FIGS. 8A and 8B illustrate an effect of the first exemplary embodiment.
Figure 8B:
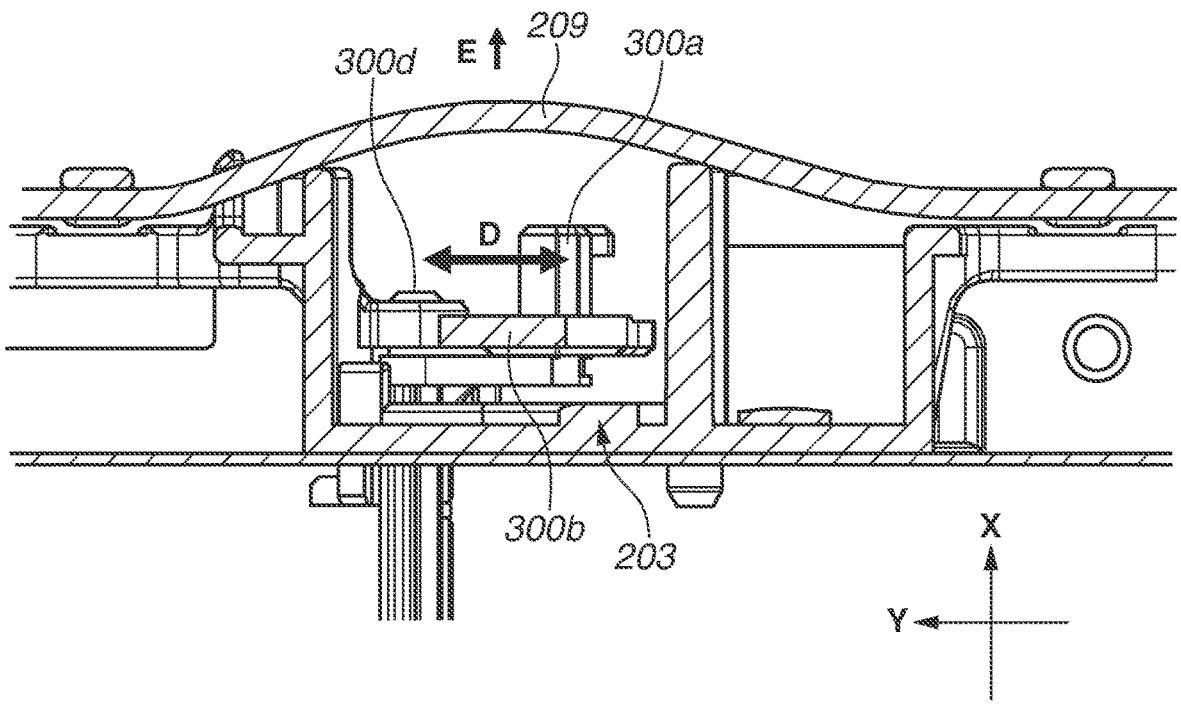

FIGS. 8A and 8B illustrate an effect of the present exemplary embodiment. FIG. 8A illustrates the state in which the process cartridge 103 is pulled out of the image forming apparatus 100, and FIG. 8B illustrates the state in which the process cartridge 103 is inserted into the image forming apparatus 100. The first link 300a moves in a direction indicated by an arrow D in conjunction with the operation of inserting and pulling out the process cartridge 103. At this time, the wire bundle pair 209 is curved in the separation direction E as described above, and thus a contact between the first link 300a and the wire bundle pair 209 can be prevented. Therefore, the present exemplary embodiment can prevent damage of the wire bundle pair 209 that otherwise may be caused due to a contact between the first link 300a and the wire bundle pair 209 when the process cartridge 103 is inserted or pulled out.

Figure 9:
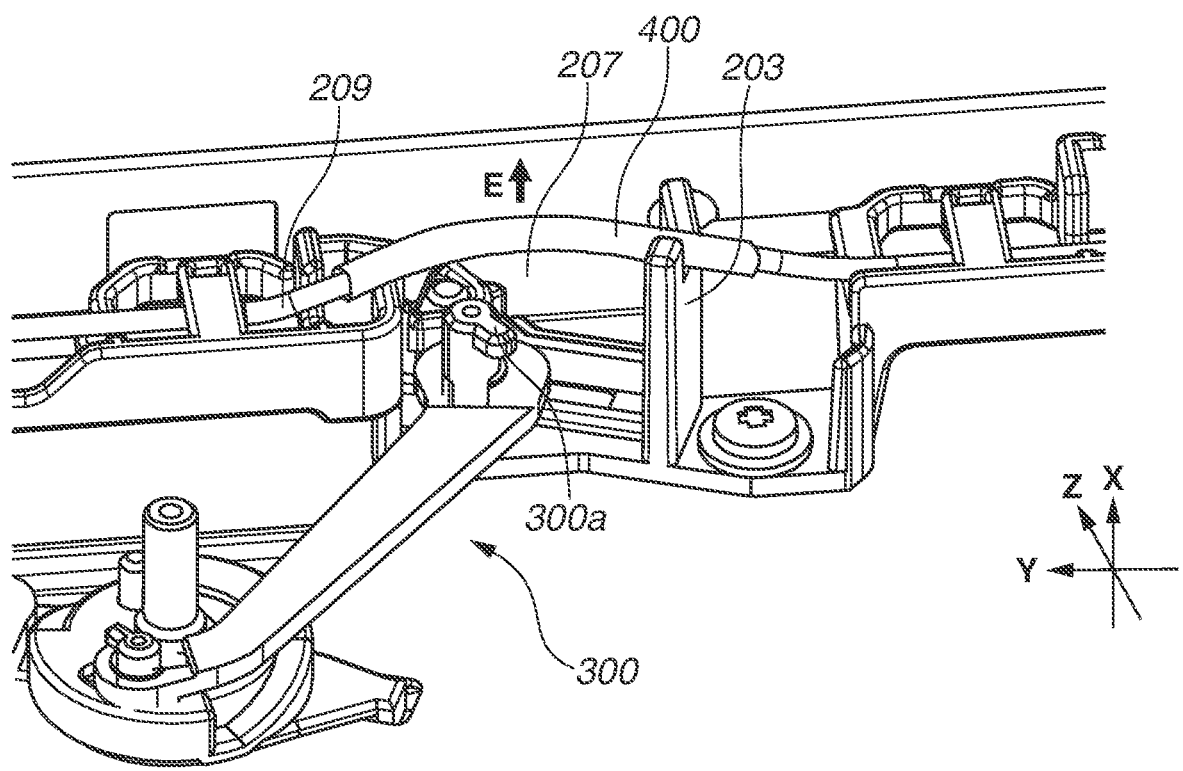
FIG. 9 is a cross-sectional perspective view of a wire bundle holding unit according to a second exemplary embodiment.

FIG. 9 is a cross-sectional perspective view of a wire bundle holding unit according to a second exemplary embodiment. A portion in the second exemplary embodiment a description of which overlaps the description in the first exemplary embodiment will be indicated by the same reference numeral as the first exemplary embodiment and will not be repeatedly described below. In FIG. 9, a binding tape 400 is wound around the outer peripheral surface of the wire bundle pair 209 at least in the partial region facing the gap 207. The binding tape 400 binds the plurality of signal lines and power lines forming the wire bundle pair 209.

An effect specific to the second exemplary embodiment is that the rigidity of the wire bundle pair 209 increases in the region where the binding tape 400 is wound, and the wire bundle pair 209 can be further curved in the separation direction E compared to that in the first exemplary embodiment. Therefore, the second exemplary embodiment allows the electric wiring guide 203 to be configured to have a smaller size than the size thereof in the first exemplary embodiment while preventing a contact between the first link 300a and the wire bundle pair 209. The second exemplary embodiment has been described citing the configuration in which the wire bundle pair 209 is bound by the binding tape 400 as an example, but the wire bundle pair 209 may be bound by a cable tie, or the second exemplary embodiment may be configured in such a manner that the wire bundle pair 209 is twisted, at least in the partial region facing the gap 207.

The above-described first and second exemplary embodiments have been described based on the configuration including the first guide member 203a, the second guide member 203b, the third guide member 203c, and the fourth guide member 203d, but the configuration of the guide unit is not limited thereto. The guide unit may be configured to include the third guide member 203c but not the fourth guide member 203d or may be configured to include the fourth guide member 203d but not the third guide member 203c.

Further, the above-described first and second exemplary embodiments have been described assuming that the image forming apparatus 100 is configured in such a manner that the power switch wire bundle 202 and the sheet feeding solenoid wire bundle 206a extend across a space directly above the first link 300a, which is a movable portion, but the type of the wire bundle applicable to one embodiment of the present disclosure is not limited thereto. To one embodiment of the present disclosure, any type of electric wiring is applicable as long as the electric wiring transmits an electric signal or electric power. Further, the electric wiring may be formed from a flexible flat cable or may be formed from a flexible printed circuit instead of the wire bundle.

Further, the above-described first and second exemplary embodiments have been described citing the first link 300a pivotable about the first joint 300d as an example of the movable portion, but the movable portion may be a rotational member such as a gear. Alternatively, the movable portion may be configured to be slidably movable along the surface of the frame 210. In addition, the guide configuration according to the embodiments of the present disclosure is applicable to not only the movable portion but also an edge of a metal plate, an edge of a mold, an electric element, a heat generation element, and the like that may inflict damage on the electric wiring by a contact therewith.

Further, the above-described first and second exemplary embodiments have been described citing the image forming apparatus 100 as an example of the power supply apparatus, but the embodiments of the present disclosure are not limited thereto. The embodiments of the present disclosure are also applicable to another electric apparatus as long as the electric apparatus is a power supply apparatus including the electric wiring guide 203 that guides the wire bundle pair 209.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2021-030082, filed Feb. 26, 2021, which is hereby incorporated by reference herein in its entirety.

What is claimed is:

1. A power supply apparatus comprising:
    a frame having a plate-shape;
    electric wiring configured to transmit an electric signal or electric power;
    a guide unit configured to guide the electric wiring along a surface of the frame; and
    a facing member disposed at a position closer to the surface of the frame than a position of the electric wiring, where the facing member overlaps the electric wiring when viewed in a direction perpendicular to the surface of the frame,
    wherein the guide unit includes a first guide member and a second guide member in contact with the electric wiring from one side close to the surface of the frame, where the first guide member and the second guide member are disposed at respective positions with the facing member disposed between the first guide member and the second guide member in a longitudinal direction of the electric wiring,
    wherein the guide unit further includes a third guide member in contact with the electric wiring from a side that is opposite of the one side from where the first guide member and the second guide member are in contact with the electric wiring, wherein the third guide member is disposed at a position not in a region between the first guide member and the second guide member in the longitudinal direction of the electric wiring, and
    wherein the electric wiring is curved in a direction away from the facing member in the region between the first guide member and the second guide member.

2. The power supply apparatus according to claim 1, wherein the third guide member is disposed in a first region that is opposite of the facing member relative to the first guide member in the longitudinal direction of the electric wiring.

3. The power supply apparatus according to claim 2,
    wherein the guide unit further includes a fourth guide member in contact with the electric wiring from the that is opposite side, and
    wherein the fourth guide member is disposed in a second region that is opposite of the facing member relative to the second guide member in the longitudinal direction of the electric wiring.

4. The power supply apparatus according to claim 1, wherein the third guide member is disposed in a second region that is opposite of the facing member relative to the second guide member in the longitudinal direction of the electric wiring.

5. The power supply apparatus according to claim 1, wherein, when viewed in the direction perpendicular to the surface of the frame, the facing member is movable between a position where the facing member overlaps the electric wiring and a position where the facing member does not overlap the electric wiring.

6. The power supply apparatus according to claim 5, wherein the facing member is pivotable about a pivot axis extending in the direction perpendicular to the surface of the frame.

7. The power supply apparatus according to claim 1,
    wherein the facing member is connected to a mechanism for preventing erroneous attachment that operates when a cartridge is attached, and
    wherein the facing member is located at a position where the facing member overlaps the electric wiring in a state before the cartridge is attached and is located at a position where the facing member does not overlap the electric wiring in a state after the cartridge is attached.

8. The power supply apparatus according to claim 1, wherein, when viewed in the direction perpendicular to the surface of the frame, the facing member is an electric element or a heat generation element disposed at a position where the facing member overlaps the electric wiring.

9. The power supply apparatus according to claim 1, wherein a first protrusion portion of the first guide member that protrudes toward a facing side on which the first guide member faces the electric wiring or a second protrusion portion of the second guide member that protrudes toward a facing side on which the second guide member faces the electric wiring is located at a position far from the frame as compared to, or at the same position as, a third protrusion portion of the third guide member that protrudes toward a facing side on which the third guide member faces the electric wiring in the direction perpendicular to the surface of the frame.

10. The power supply apparatus according to claim 1,
wherein a first protrusion portion of the first guide member that protrudes toward a facing side on which the first guide member faces the electric wiring and a second protrusion portion of the second guide member that protrudes toward a facing side on which the second guide member faces the electric wiring are located at positions closer to the frame as compared to a third protrusion portion of the third guide member that protrudes toward a facing side on which the third guide member faces the electric wiring in the direction perpendicular to the surface of the frame, and
wherein a distance between any one of (i) the first protrusion portion or the second protrusion portion and (ii) the third protrusion portion in the direction perpendicular to the surface of the frame is shorter than a smallest diameter of the electric wiring.

11. A power supply apparatus comprising:
a frame;
an electric wiring;
a facing member disposed at a position closer to a surface of the frame than a position of the electric wiring, where the facing member overlaps the electric wiring when viewed in a direction perpendicular to the surface of the frame; and
a guide unit configured to guide the electric wiring along the surface of the frame,
wherein the guide unit includes:
a first member in contact with the electric wiring from one side close to the surface of the frame,
a second member,
a third member in contact with the electric wiring from a side that is opposite of the one side from where the first member is in contact with the electric wiring, wherein the third member is disposed in a first region that is opposite of the facing member relative to the first member in a longitudinal direction of the electric wiring, and
a fourth member in contact with the electric wiring from a side that is opposite of the one side from where the first member is in contact with the electric wiring, wherein the fourth member is disposed in a second region that is opposite of the facing member relative to the second member in the longitudinal direction of the electric wiring,
wherein the facing member is placed between the first member and the second member in the longitudinal direction of the electric wiring, and
wherein the electric wiring is curved in a direction away from the facing member in a region between the first member and the second member.

12. The power supply apparatus according to claim 11, wherein the second member is in contact with the electric wiring from the one side where the first member is in contact with the electric wiring.

13. The power supply apparatus according to claim 12, wherein, when viewed in the direction perpendicular to the surface of the frame, the facing member is movable between a position where the facing member overlaps the electric wiring and a position where the facing member does not overlap the electric wiring.

14. The power supply apparatus according to claim 12, wherein the facing member is pivotable about a pivot axis extending in the direction perpendicular to the surface of the frame.

15. The power supply apparatus according to claim 12,
wherein the facing member is connected to a mechanism for preventing erroneous attachment that operates when a cartridge is attached, and
wherein the facing member is located at a position where the facing member overlaps the electric wiring in a state before the cartridge is attached and is located at a position where the facing member does not overlap the electric wiring in a state after the cartridge is attached.

16. The power supply apparatus according to claim 12, wherein, when viewed in the direction perpendicular to the surface of the frame, the facing member is an electric element or a heat generation element disposed at a position where the facing member overlaps the electric wiring.

17. The power supply apparatus according to claim 12, wherein a first protrusion portion of the first member that protrudes toward a facing side on which the first member faces the electric wiring or a second protrusion portion of the second member that protrudes toward a facing side on which the second member faces the electric wiring is located at a position far from the frame as compared to, or at the same position as, a third protrusion portion of the third member that protrudes toward a facing side on which the third member faces the electric wiring in the direction perpendicular to the surface of the frame.

18. The power supply apparatus according to claim 11, wherein the second member is not in contact with the electric wiring.

19. A power supply apparatus comprising:
a frame;
an electric wiring;
a facing member disposed at a position closer to a surface of the frame than a position of the electric wiring, where the facing member overlaps the electric wiring when viewed in a direction perpendicular to the surface of the frame; and
a guide unit configured to guide the electric wiring along the surface of the frame,
wherein the guide unit includes:
a first member,
a second member,
a third member in contact with the electric wiring from a side that is opposite of one side from where the first member is in contact with the electric wiring, wherein the third member is disposed in a first region that is opposite of the facing member relative to the first member in a longitudinal direction of the electric wiring, and
a fourth member in contact with the electric wiring from a side that is opposite of the one side from where the first member is in contact with the electric wiring, wherein the fourth member is disposed in a second region that is opposite of the facing member relative to the second member in the longitudinal direction of the electric wiring, wherein the facing member is placed between the first member and the second member in the longitudinal direction of the electric wiring, wherein the electric wiring is curved in a direction away from the facing member in a region between the first member and the second member, wherein a first protrusion portion of the first member that protrudes toward a facing side on which the first member faces the electric wiring and a second protrusion portion of the second member that protrudes toward a facing side on which the second member faces the electric wiring are located at positions closer to the frame as compared to a third protrusion portion of the third member that protrudes toward a facing side on which the third member faces the electric wiring in the direction perpendicular to the surface of the frame, and wherein a distance between any one of (i) the first protrusion portion or the second protrusion portion and (ii) the third protrusion portion in the direction perpendicular to the surface of the frame is shorter than a smallest diameter of the electric wiring.

20. The power supply apparatus according to claim 19, wherein the first member and the second member are not in contact with the electric wiring.

21. The power supply apparatus according to claim 19, wherein, when viewed in the direction perpendicular to the surface of the frame, the facing member is movable between a position where the facing member overlaps the electric wiring and a position where the facing member does not overlap the electric wiring.

22. The power supply apparatus according to claim 19, wherein the facing member is pivotable about a pivot axis extending in the direction perpendicular to the surface of the frame.

23. The power supply apparatus according to claim 19,
wherein the facing member is connected to a mechanism for preventing erroneous attachment that operates when a cartridge is attached, and
wherein the facing member is located at a position where the facing member overlaps the electric wiring in a state before the cartridge is attached and is located at a position where the facing member does not overlap the electric wiring in a state after the cartridge is attached.

24. The power supply apparatus according to claim 19, wherein, when viewed in the direction perpendicular to the surface of the frame, the facing member is an electric element or a heat generation element disposed at a position where the facing member overlaps the electric wiring.

* * * * *